United States Patent
Lindsey

(10) Patent No.: US 7,005,237 B2
(45) Date of Patent: Feb. 28, 2006

(54) METHOD OF MAKING INFORMATION STORAGE DEVICES BY MOLECULAR PHOTOLITHOGRAPHY

(75) Inventor: Jonathan S. Lindsey, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 212 days.

(21) Appl. No.: 10/445,977

(22) Filed: May 27, 2003

(65) Prior Publication Data

US 2004/0241584 A1 Dec. 2, 2004

(51) Int. Cl.
*G11C 13/02* (2006.01)

(52) U.S. Cl. .................. 430/311; 430/394; 430/966; 430/942; 430/944; 365/151; 365/153; 365/106

(58) Field of Classification Search ................ 430/311, 430/394, 966, 942, 944; 365/151, 153, 106
See application file for complete search history.

(56) References Cited

U.S. PATENT DOCUMENTS 6,121,048 A * 9/2000 Zaffaroni et al. ............ 436/45

| | | |
|---|---|---|
| 6,208,553 B1 | 3/2001 | Gryko et al. |
| 6,212,093 B1 | 4/2001 | Lindsey |
| 6,324,091 B1 | 11/2001 | Gryko et al. |
| 6,381,169 B1 | 4/2002 | Bocian et al. |
| 6,416,952 B1 | 7/2002 | Pirrung et al. |
| 6,451,942 B1 | 9/2002 | Li et al. |
| 2003/0081463 A1 | 5/2003 | Bocian et al. |

* cited by examiner

*Primary Examiner*—John A. McPherson
*Assistant Examiner*—Daborah Chacko-Davis
(74) *Attorney, Agent, or Firm*—Myers Bigel Sibley & Sajovec, PA

(57) ABSTRACT

A photolithographic method of making an information storage device having different storage characteristics at a plurality of discrete memory locations thereon, comprises the steps of: (a) providing a substrate having a surface portion, said surface portion having a linking group coupled thereto or charge storage group coupled thereto, said linking group or charge storage group having a photocleavable protecting group thereon; (b) exposing at least one first discrete segment of said surface portion to radiant energy sufficient to cleave said protecting group from said linking group or charge storage group and generate a deprotected group, so that said group is deprotected in at least one first discrete memory location and preferably said group remains protected in at least one second discrete memory location. Additional groups are then coupled to the deprotected group as desired. Products produced by such methods are also described.

22 Claims, 6 Drawing Sheets

METHOD OF MAKING INFORMATION STORAGE DEVICES BY MOLECULAR PHOTOLITHOGRAPHY

FIELD OF THE INVENTION

The present invention generally concerns methods for the production of molecular memory devices, and the memory devices so made.

BACKGROUND OF THE INVENTION

General challenges in fabricating a hybrid chip containing molecular materials for information storage are that (1) the charge-storage molecule must be attached to an electroactive surface, (2) the electrolyte must be present in the same location as the charge-storage molecule but not elsewhere, (3) the counterelectrode must be located at a controlled distance from the charge-storage molecules. Particularly pressing problems are that often the methods for attachment of molecules to surfaces require very high concentrations, high temperature, and/or the use of reactive intermediates [Cleland, G. et al., *J. Chem. Soc. Faraday Trans.* 1995, 91, 4001–4003; Buriak, J. M. *Chem. Commun.* 1999, 1051–1060; Linford, M. R. et al., *J. Am. Chem. Soc.* 1995, 117, 3145–3155; Hamers, R. J. et al., *Am. Chem. Res.* 2000, 33, 617–624; Haber, J. A. et al., *J. Phys. Chem. B* 2000, 104, 9947–9950]. Such conditions are readily applicable to small robust molecules but become less satisfactory and often fail altogether as the molecules become larger and/or more elaborate. One example in this regard is the attachment of molecules to Si or Ge. Thus, the reaction of an alcohol or thiol-containing molecule at elevated temperature (nearly 200° C.) at concentrations $\geq 0.1$ M (and often with neat materials; e.g., ~10 M) affords the siloxane or thiosiloxane linkage [Cleland, G. et al., *J. Chem. Soc. Faraday Trans.* 1995, 91, 4001–4003; Bocian, D. F. et al., U.S. patent application Ser. No. 2003/0081463 (May 1, 2003)]. Ferrocene-alcohols tend to attach well under these conditions, porphyrin-alcohols attach less well, and triple-decker lanthanide sandwich coordination compounds bearing an alcohol tend to fail to attach altogether. Charge-storage molecules comprised of multiple triple deckers are ideally suited for storage of multiple bits of information [Lindsey, J. S. U.S. Pat. No. 6,212,093 B1; Schweikart, K. -H. et al., *J. Matter. Chem.* 2002, 12, 808–828], but cannot be attached to silicon or germanium under these conditions. A second example employs the reaction of an alkane with a Si surface, affording an alkylsilane linkage [Buriak, J. M. *Chem. Commun.* 1999, 1051–1060]. This procedure also requires very high concentrations for reaction. A third example is the attachment of charge-storage molecules to glassy carbon. McCreery has described the attachment of diazonium salt derivatives of simple aromatic compounds (e.g., stilbene) to glassy carbon electrodes [Ranganathan, S. et al., *Nanolett.* 2001, 1, 491–494]]. However, many redox-active molecules of interest for use in charge-storage applications, particularly those that store charge at low potential, react with diazonium salts. A case in point is given by ferrocene, which undergoes oxidation at 0.22 V versus Ag/Ag$^+$. Aryl diazonium salts are the electrophilic reagents of choice for substitution of the ferrocene nucleus [Weinmayr, V. *J. Am. Chem. Soc.* 1955, 77, 3012–3014; Broadhead, G. D. and Pauson, P. L. *J Chem. Soc.* 1955, 367–370; Gryko, D. T. et al., *J. Org. Chem.* 2000, 65, 7356–7362]. Thus, ferrocenes, and by extension many other desirable redox-active molecules, cannot be attached to glassy carbon via the standard method employing a reactant containing a diazonium salt. In sum, new strategies are urgently needed for assembling molecular-based information-storage devices, of which attaching diverse, elaborate redox-active molecules to electroactive surfaces is an integral step.

SUMMARY OF THE INVENTION

A first aspect of the present invention is a photolithographic method of making an information storage device having different storage characteristics at a plurality of discrete memory locations thereon, comprising the steps of: (a) providing a substrate having a surface portion, the surface portion having a linking group coupled thereto, the linking group having a photocleavable protecting group thereon; and then (b) exposing at least one first discrete segment of the surface portion to radiant energy sufficient to cleave the protecting group from the linking group and generate a deprotected linking group, so that the linking group is deprotected in the at least one first discrete memory location, and optionally but preferably the linking group remains protected in at least one second discrete memory location. Such photodeprotection may be used as a general manufacturing strategy or the method may further comprise: (c) coupling a first charge storage group to the deprotected linking group at the at least one first discrete memory location; (d) exposing at least one of the second discrete memory location to radiant energy sufficient to cleave the protecting group from the linking group and generate a deprotected linking group in the at least one second discrete memory location; and then (e) coupling a second charge storage group to the linking group at the at least one second discrete memory location, wherein the second charge storage group is different from the first charge storage group, to thereby produce an information storage device having different storage characteristics at a plurality of discrete memory locations.

In some embodiments of the foregoing, the first charge storage group consists essentially of a charge storage molecule. In some embodiments of the foregoing, the first charge storage group comprises a charge storage molecule coupled to at least one ancillary group such as a linking group, electrolyte group, or charge storage molecule. In some embodiments of the foregoing, the linking group is directly coupled to the surface portion; in other embodiments of the foregoing, the linking group is coupled to the surface portion through an intermediate charge storage group.

A further aspect of the present invention is a method of making an information storage device having different storage characteristics at a plurality of discrete memory locations thereon, comprising the steps of: (a) providing a substrate having a surface portion, the surface portion having a charge storage group coupled thereto, the charge storage group having a photocleavable protecting group thereon; (b) exposing at least one first discrete segment of the surface portion to radiant energy sufficient to cleave the protecting group from the charge storage group and generate a deprotected charge storage group, so that the charge storage group is deprotected in the at least one first discrete memory location, and optionally but preferably the charge storage group remains protected in at least one second discrete memory location. Such photodeprotection may be used as a general manufacturing strategy or the method may further comprise: (c) coupling a first ancillary group to the charge storage group at the at least one first discrete memory location; (c1) exposing at least one of the second discrete memory location to radiant energy sufficient to cleave the protecting group from the charge storage group and generate a deprotected charge storage group in the at least one second discrete memory location; and then (e) coupling a second ancillary group to the charge storage group at the at least one second discrete memory location, wherein the first ancillary group and the second ancillary group are different, to thereby produce an information storage device having different storage characteristics at a plurality of discrete memory locations.

In some embodiments of the foregoing, the ancillary group is an electrolyte; in other embodiments of the foregoing, the ancillary group is a linking group; in still other embodiments of the foregoing, the ancillary group is an additional charge storage group. In some embodiments of the foregoing, the linking group is connected to an electrode at each of the discrete memory locations, with the method further comprising the step of coupling a second electrode to the ancillary group at each of the discrete memory locations. In some embodiments of the foregoing, the first ancillary group is a first linking group and the second ancillary group is a second linking group, and the method further comprises the steps of coupling a first conductor to the first linking group and a second conductor to the second linking group, wherein the first and second conductors are different. In some embodiments of the foregoing, the first and second linking groups are selected from the group consisting of phosphate linkers and thiol linkers and the first and second conductors are selected from the group consisting of metal oxides and gold. In some embodiments of the foregoing, the charge storage group is directly coupled to the surface portion; in other embodiments the charge group is coupled to the surface portion through an intermediate electrolyte group.

The exposing steps described above may be carried out by any suitable technique, such as by masking or by maskless photolithography. Any suitable radiant energy may be used, including for example electron beam and x-ray energy, visible light and ultraviolet light.

Further aspects of the present invention are a memory device produced by methods described herein and methods of use thereof.

The present invention is described in greater detail in the drawings herein and the specification set forth below.

DETAILED DESCRIPTION OF THE PREFERRED EMBODIMENTS

Figure 1:
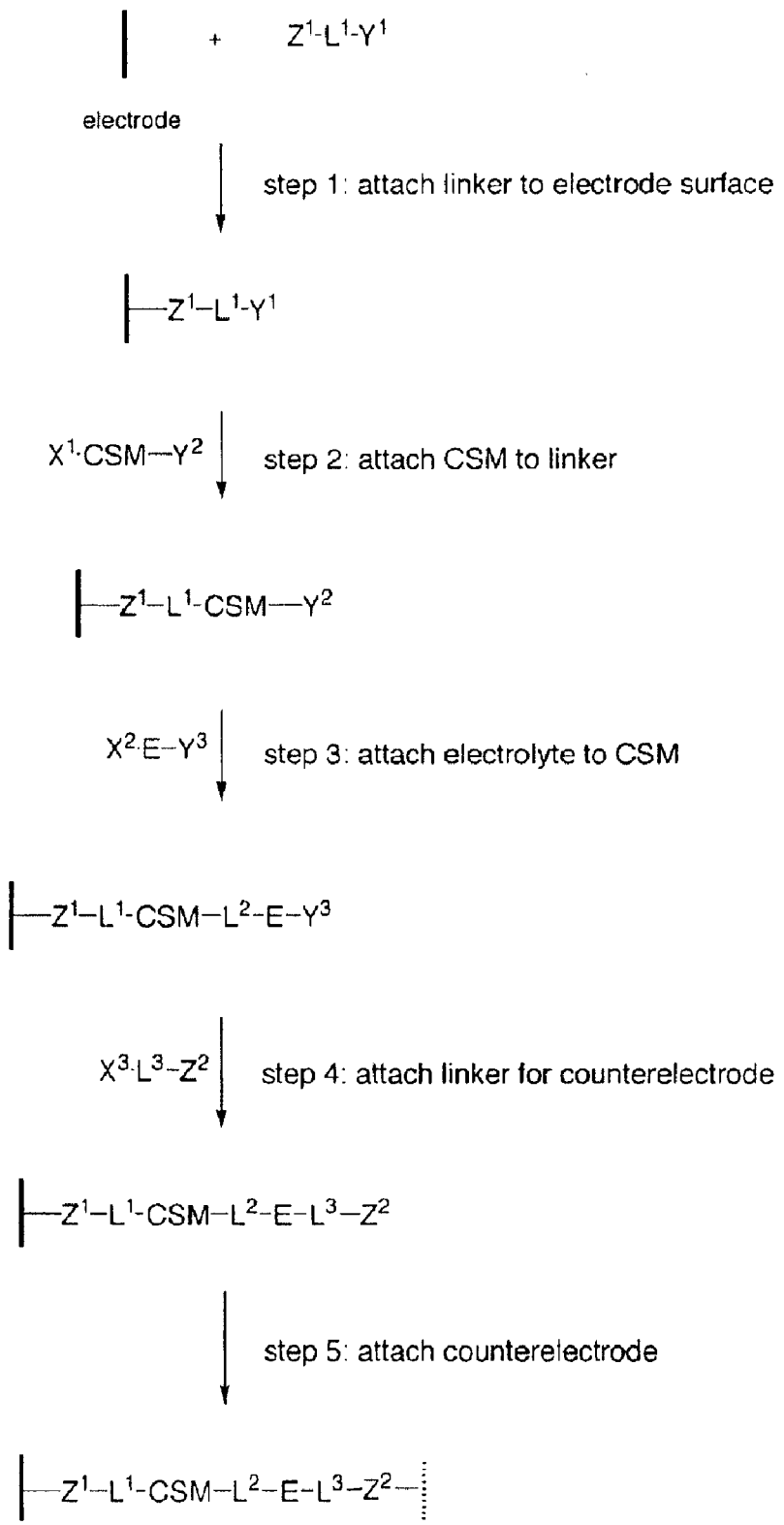
FIG. 1. Multi-step fabrication strategy for assembling an information-storage device comprised of a charge-storage molecule and attached electrolyte in a sandwich architecture between two electrodes.

"Coupling" as used herein refers to the coupling of one molecule to another by one or more strong bonds, such as covalent bonds or electrostatic bonds. Coupling steps may be direct or indirect (e.g., coupling through an intervening molecule such as a photocleavable linking group, additional linking group, etc.).

"Substrate" as used herein means any substrate, including but not limited to organic and inorganic solid substrates such as glass, silicon, silicon dioxide, etc., which may be insulators, conductors, etc.

"Charge storage molecule" and "storage molecule" are used interchangeably herein and refer to a molecule having one or more oxidation states that can be used for the storage of information (e.g. a molecule comprising one or more redox-active subunits). Preferred storage molecules have two or more different and distinguishable non-neutral oxidation states. Such charge storage molecules generally comprise a backbone polymer.

"Charge storage group" as used herein refers to a functional group within a charge storage molecule that causes the charge storage molecule to have one or more oxidation states and enables the storage of information therein (e.g., a redox-active substituent).

"Electrolyte" or "electrolyte group" as used herein refers to a molecule or substituent of a molecule that is an electrical conductor and that conducts current via migration of charged molecules.

"Linking group" as used herein is a molecule used to couple two different molecules, two subunits of a molecule, or a molecule to a substrate.

"Photocleavable protecting group" as used herein refers to a substituent or functional group of a molecule that (a) can be cleaved from that molecule by the application of radiant energy; and (b) when present on the molecule prevents the molecule from substantially participating in a chemical reaction in which that molecule would otherwise participate if the protecting group was cleaved from the molecule by application of radiant energy.

"Protected group" as used herein refers to a molecule or group to which a protecting group is coupled, and hence is not available to substantially participate in a particular chemical reaction.

"Deprotected group" as used herein refers to a molecule or group from which a protecting group has been cleaved or removed, and hence is available to participate in a particular chemical reaction.

"Substrate" as used herein refers to any preferably solid material suitable for the attachment of one or more molecules. Substrates can be formed of materials including, but not limited to glass, plastic, silicon, minerals (e.g. quartz), semiconducting materials, ceramics, polymers, metals, etc.

"Porphyrin macrocycle" as used herein refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, beta-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Preferred porphyninic macrocycles comprise at least one 5-membered ring.

"Sandwich coordination compound" or "sandwich coordination complex" as used herein refers to a compound of the formula $L^n M^{n-1}$, where each L is a heterocyclic ligand such as a porphyninic macrocycle), each M is a metal, n is 2 or more, most preferably 2 or 3, and each metal is positioned between a pair of ligands and bonded to one or more hetero atom (and typically a plurality of hetero atoms, e.g., 2, 3, 4, 5). Examples include double decker and triple decker sandwich coordination compounds. One, two, three or more sandwich coordination compounds may be included in a particular charge storage molecule.

All United States patent references cited herein are to be incorporated herein by reference in their entirety.

1. Storage Molecules.

Charge storage molecules used herein can comprise a redox-active molecule where that molecule has two or more (e.g. 8) different and distinguishable oxidation states. Typically, but not necessarily, such multi-state molecules will be composed of several redox-active units (e.g. porphyrins or ferrocenes). In another exemplary embodiment, the storage medium can comprise two or more different species of storage molecule. Each storage molecule comprises at least one redox-active unit, but can easily contain two or more redox-active units. Where each species of storage molecule has a single, non-neutral, oxidation state, the storage medium achieves multiple bit storage by having a plurality of such molecules where each molecule has a different and distinguishable oxidation state (e.g. each species of molecule oxidizes at a different and distinguishable potential). Of course, each species of molecule can have a multiplicity of different and distinguishable oxidation states. Such charge storage molecules are known and described in, for example, U.S. Pat. No. 6,208,553 to Gyko et al.; U.S. Pat. No. 6,381,169 to Bocian et al.; and U.S. Pat. No. 6,324,091 to Gryko et al.

In other embodiments of the invention, the charge storage molecule can comprise at least one sandwich coordination compound. Examples include double-decker sandwich coordination compounds and triple-decker sandwich coordination compounds. Such Compounds are known and described in, for example, U.S. Pat. No. 6,212,093 to Lindsey and U.S. Pat. No. 6,451,942 to Li et al. Of course, the charge storage molecule can include mixed charge storage substituents, such as a first sandwich coordination compound linked to a porphyninic macrocycle, etc.

2. Assembly and Lithography of Charge Storage Molecules.

In Part A, a strategy for the stepwise assembly of the charge-storage material is described. A broad range of chemistries is identified to accompany this strategy. In Part B, a solution to a related problem is described: how to put distinct types of redox-active molecules, linkers, electrolytes, and related molecular materials in distinct locations in a chip. The solution to this problem employs photocleavable protecting groups (e.g., molecular photolithography); this solution constitutes a powerful extension of the stepwise fabrication approach. The ability to control the types of molecules that are placed in particular locations, and thereby afford spatial control over desired device functions, greatly facilitates the fabrication of hybrid molecular electronic chips.

A. Stepwise Assembly. One approach toward fabrication of sandwich devices is to synthesize the molecule that will span the two electrodes, equip the molecule with orthogonal surface attachment groups, employ two different materials for the two electrodes, and add a solution of the molecule to the propositioned electrodes and allow orthogonal self-assembly to occur. Orthogonal self-assembly refers to self-organization of the molecules between the electrodes based on the chemical nature of the surface attachment groups on the molecule and the composition of the two electrodes. Examples of such systems include thiol/carboxylic acid or thiol/phosphonic acid for attachment to Au and $In_2O_3/SnO_2$ (ITO) electrodes [Gardner, T. J. et al., *J. Am. Chem. Soc.* 1995, 117, 6927–6933]. This approach is satisfactory in the cases where the surface attachment protocols are compatible with the molecules composed of all components that are required to span the electrodes.

An alternative approach proceeds in stepwise manner as outlined in FIG. 1. In step 1, a linker $L^1$ bearing a surface attachment group $Z^1$ and reactive functional group $Y^1$ is exposed under appropriate conditions to the electrode, whereupon binding occurs. The linker call be a linear structure with a single binding site or a multi-legged linker with multiple binding sites for attachment to the surface. In step 2, a charge-storage molecule (CSM) bearing a functional group $X^1$ complementary to that of $Y^1$ (but not to $Y^2$) is then added, giving binding of $X^1$ and $Y^1$ and attaching the CSM to the linker. In step 3, an electrolyte (E) bearing functional groups $X^2$ and $Y^3$ is allowed to react with the end group $Y^2$ on the CSM, creating linker $L^2$. Reaction Occurs smoothly given the complementary nature of the groups $X^2$ and $Y^2$. In step 4, a linker for attachment to the counterelectrode is attached to the end of the electrolyte by reaction of groups $X^3$ and $Y^3$, creating linker $L^3$ In the final step, the counterelectrode is attached to the surface attachment group $Z^2$. The advantages of this approach are that the first linker can be attached under suitable conditions, with the remaining components assembled in a stepwise manner. This approach avoids the strategy requiring the pre-synthesis of an elaborate molecular entity composed of $Z^1$—$L^1$—CSM—$L^2$—E—L —$Z^2$.

(1) Reactive groups. A variety of reactive functionalities can be employed in the assembly steps. A key issue is that the reactive groups and the reaction conditions employed must afford clean reaction without damage to the nascent molecular structure. Preferred functional groups are those that readily assemble at room temperature without significant byproducts, as shown in Table 1. Functional groups that also can be used, but are less preferred due to the requirement for Pd-mediated coupling reactions, include ethylene, iodo, bromo, and 4,4,5,5-tetramethyl-1,3,2-dioxaborolane. A number of issues bear on the choice of reactive groups in addition to the cleanliness and ease of reaction, including the structural rigidity of the resulting linker, the extent of electronic communication between components afforded by the resulting linker, the resistance of the linker toward electrochemical oxidation, and the compatibility of the resulting linker toward subsequent assembly steps.

A critical element of this design is the use of suitable attachment groups Z, Y, and X such that (1) the Y and X groups do not compete with the surface-attachment group Z during step 1, and (2) the reaction of the Y and X groups can be accomplished efficiently under mild conditions, thereby ensuring that essentially all the information-storage molecules are derivatized without damage or displacement from the surface. These criteria place severe restrictions on the scope of functional groups Z, Y, and X as well as the associated chemical reactions that can be employed. The types of reactive groups Shown in Table 1 generally can be reacted via self-assembly procedures, where smooth reaction Occurs under gentle conditions, often without added reagents.

(2) Charge-storage molecules. We have employed charge-storage molecules that afford cationic oxidation states (rather than anionic) given the greater stability of cations (versus anions) under real-world conditions. In general, the charge storage molecule (CSM) is comprised of a porphyninic molecule, a triple-decker sandwich coordination compound of porphyninic macrocycles, an array of porphyninic molecules, an array of triple deckers, or a metallocene [Gryko, D. T. et al., U.S. Pat. No. 6,208,553 B1; Lindsey, J. S. U.S. Pat. No. 6,212,093 B1; Clausen, P. C. and Lindsey, J. S. U.S. Pat. No. 10 6,272,038 B1; Bocian, D. F. et al., U.S. Pat. No. 6,381,169 B1].

TABLE 1

Reactive groups and product linkages in attachment strategies.

| Reactive group (X or Y) | Reactive group (Y or X) | Other component | Product Linkage |
|---|---|---|---|
| aldehyde | acyl hydrazide | | acyl hydrazone |
| aldehyde | amine | | imine |
| aldehyde | amine | NaBH$_3$CN, Ac$_2$O | N,N-dialkylacetamide |
| salicylaldehyde | amine | | salicylaldimine |
| salicylaldehyde | acyl hydrazide | | H-bonded acyl hydrazone |
| isocyanate | amine | | urea |
| isocyanate | alcohol/phenol | | carbamate |
| isothiocyanate | amine | | thiourea |
| isothiocyanate | alcohol/phenol | | thiocarbamate |
| 2-iminothiolane | amine | | amide-alkyl-thiol |
| benzyl halide | phenol or alcohol | | ether |
| phenacyl bromide | phenol or alcohol | | phenacyl ether |
| halooacetamide | alcohol or carboxylic acid | | α-ether-acetamide or α-ester-acetamide amide |
| acid chloride thioester/active ester acid anhydride | amine | | |
| sulfonyl chloride | amine | | sulfonamide |
| boronic acid | diol | | alkyl boronate |
| acrylate | thiol | | thioether |
| aldehyde | diol | | acetal |
| epoxide | amine | | hydroxyalkylamine |
| dipyrrin | dipyrrin | divalent metal (Zn, Mg, Pd, Cu, etc.) | bis(dipyrrinato)metal |
| phenanthroline | phenanthroline | metal (Zn, Pd, Cu, Au, etc.) | bis-(phenanthrolino)metal |
| phosphonate | zirconium dichloride or zirconium hydroxide | | zirconyl phosphonate |

TABLE 1-continued

Reactive groups and product linkages in attachment strategies.

| Reactive group (X or Y) | Reactive group (Y or X) | Other component | Product Linkage |
|---|---|---|---|
| acac | acac | divalent metal (Zn, Mg, Pd, Cu, etc.) | bis(acac)metal |

(3) Surface attachment groups. The surface attachment group (Z) may be a protected or unprotected reactive site or group on the linker such as a carboxylic acid, alcohol, thiol, selenol, tellurol, phosphonic acid, or monomercaptophosphonic acid. Attachment can also be accomplished without a distinct surface attachment group (i.e., direct attachment). It is understood that attachment to the electroactive surface can be accompanied by loss of a proton, protecting group, or reactive entity on the reactive site Z. An example of the loss of a reactive entity is provided in the case of the amine derivatives (see (1) below). Prior to binding, the amine is converted to the diazonium salt; loss of N$_2$ upon binding affords direct linkage to the carbon atom of the linker. Examples of Z—L— are as follows:
 (a) 4-carboxyphenyl,
   2-(4-hydroxyphenyl)ethynyl,
   4-(2-(4-hydroxyphenyl)ethynyl)phenyl,
   4-hydroxymethylphenyl,
   4-(3-hydroxypropyl)phenyl,
   4-(2-(4-hydroxymethylphenyl)ethynyl)phenyl;
 (b) 4-hydroxyphenyl,
   2-(4-hydroxyphenyl)ethynyl,
   4-(2-(4-hydroxyphenyl)ethynyl)phenyl,
   4-hydroxymethylphenyl,
   4-(2-hydroxyethyl)phenyl,
   4-(3-hydroxypropyl)phenyl,
   4-(2-(4-hydroxymethylphenyl)ethynyl)phenyl;
 (c) 4-mercaptophenyl,
   2-(4-mercaptophenyl)ethynyl,
   4-(2-(4-mercaptophenyl)ethynyl)phenyl,
   4-mercaptomethylphenyl,
   4-(2-mercaptophenyl)phenyl,
   4-(3-mercaptopropyl)phenyl,
   4-(2-(4-mercaptomethylphenyl)ethynyl)phenyl;
 (d) 4-selenylphenyl,
   2-(4-selenylphenyl)ethynyl,
   4-selenylmethylphenyl,
   4-(2-selenylphenyl)phenyl,
   4-(3-selenylpropyl)phenyl,
   4-selenylmethylphenyl,
   4-(2-(4-selenylphenyl)ethynyl)phenyl;
 (e) 4-tellurylphenyl,
   2-(4-tellurylphenyl)ethynyl,
   4-(2-(4-tellurylphenyl)ethynyl)phenyl,
   4-tellurylmethylpehnyl,
   4-(2-tellurylethyl)phenyl,
   4-(3-tellurylpropyl)phenyl,
   4-(2-(4-tellurylmethylphenyl)ethyl)phenyl;
 (f) 4-(dihydroxyphosphoryl)phenyl,
   2-[4-(dihydroxyphosphoryl)phenyl]ethynyl,
   4-[2-[4-(dihydroxyphosphoryl)phenyl]ethynyl]phenyl,
   4-[(dihydroxyphosphoryl)methyl]phenyl,
   4-[2-(dihydroxyphosphoryl)ethyl]phenyl,
   4-[2-[4-(dihydroxyphosphoryl)methylphenyl]ethynyl]phenyl;

(g) 4-(hydroxy(mercapto)phosphoryl)phenyl,
2-[4-(hydroxy(mercapto)phosphoryl)phenyl]ethynyl,
4-[2-[4-(hydroxy(mercapto)phosphoryl)phenyl]ethynyl]phenyl,
4-[(hydroxy(mercapto)phosphoryl)methyl]phenyl,
4-[2-(hydroxy(mercapto)phosphoryl)ethyl]phenyl,
4-[2-[4-(hydroxy(mercapto)phosphoryl)methylphenyl]ethynyl]phenyl;

(h) 4-cyanophenyl,
2-(4-cyanophenyl)ethynyl,
4-[2-(4-cyanophenyl)ethynyl]phenyl,
4-(cyanomethyl)phenyl,
4-(2-cyanoethyl)phenyl,
4-[2-[4-(cyanomethyl)phenyl]ethynyl]phenyl;
4-cyanobiphenyl, (i) 4-aminophenyl,
2-(4-aminophenyl)ethynyl,
4-[2-(4-aminophenyl)ethynyl]phenyl,
4-aminobiphenyl.

In addition to the monodentate linker-surface attachment groups described above, multidentate linkers can be employed [Deng, X. et al., *J. Org. Chem.* 2002, 67, 5279–5283; Galoppini, E. et al., *J. Am. Chem. Soc.* 2002, 124, 7801–7811; Fox, M. A. et al., *Langmuir* 1998, 14, 816–820]. Tripodal linkers bearing thiol, carboxylic acid, alcohol, or phosphonic acid units are particularly attractive for firmly anchoring a molecular device in an upright configuration on a planar surface.

(4) Linkers. Examples of linkers (L) comprise methyl, ethyl, propyl, butyl, 1,4-phenylene, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, 4,4''-terphenyl, 4,4'''-quatterphenyl, and no linker (i.e., C—C single bond).

(5) Electrolyte. Examples of electrolyte units include compounds bearing fixed anionic groups (trialkyl boronate, triarylboronate), fixed cationic groups (trimetlhylammonium, 4-(N-methylpyridyl), 4-(N-benzylpyridyl), trialkylphosphonium, triarylphosphinium), or ionizable groups by acid dissociation (carboxylic acid, sulfonic acid, phosphonic acid, phosphoric acid) or base protonationl (amine). A layer of charge also can be introduced by construction of one or more layers of zirconyl phosplhonate or zirconyl phosphate units. Upon attachment of the charged layer to the SAM via the derivatization (or deposition) step, the counterion (cation or anion) can be exchanged via a standard ion exchange washing process. In this manner, the mobile ion can be varied as needed from small ions (e.g., $Li^+$ or $Cl^-$) to large ions (e.g., $Ph_4P^+$ or $Ph_4B^-$). Such an ion-exchange process affords considerable latitude in the nature of the groups that are attached. The counterion can be selected from the halogens, alkaline earth metals, $R_4N^+$, $PF_6^-$, $ClO_4^-$, etc. as needed.

Figure 2:
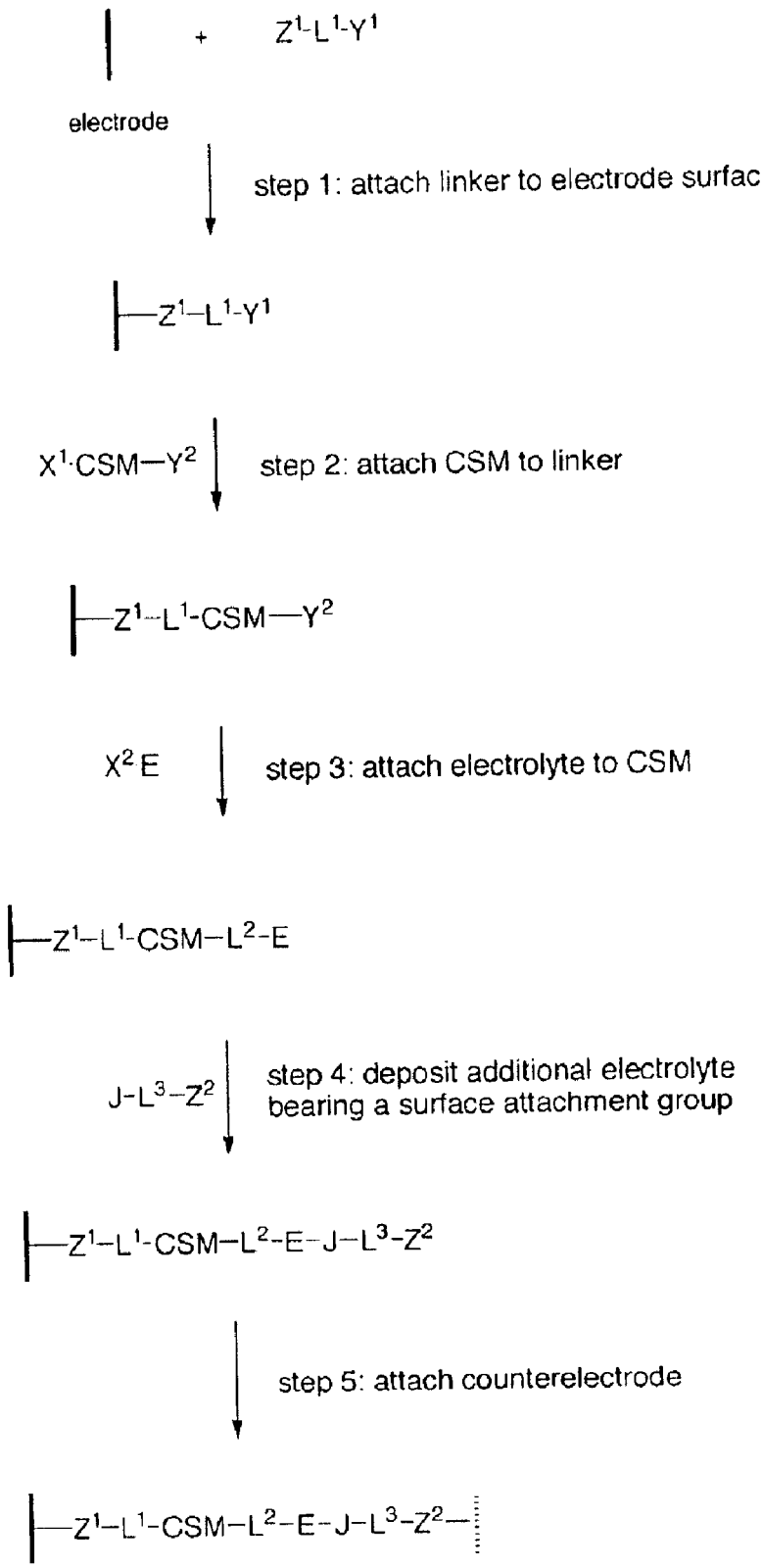
FIG. 2. Multi-step procedure for assembling an information-storage device comprised of a charge-storage molecule and deposited electrolyte in a sandwich architecture between two electrodes.

A further example of a fabrication strategy is shown in FIG. 2. In this case, the first three steps are performed as in FIG. 1. Then a fourth step, entailing the electrostatic self-assembly of a counterion group, is performed. In this step, a reagent is added that has (a) a material (J) with fixed charge complementary to that of the bound electrolyte (E), (b) a surface attachment group ($Z^2$) for binding the counterelectrode, and (c) a linker ($L^3$) between the two entities. The binding is electrostatic in nature. In step 4, the counterelectrode is constructed by binding to the surface attachment group $Z^2$. It is understood that each surface-attachment group Z may contain a proton, protecting group, or reactive group that is removed upon attachment to the surface. In this manner, a sandwich architecture is constructed in a stepwise manner, affording the charge-storage molecule and electrolyte at controlled distances between each other and between the electrode and counterelectrode. The distances are controlled by the lengths of the linkers ($L^1$, $L^2$, and $L^3$). Alternatively, it is feasible and sometimes attractive to simply deposit the electrolyte on top of the CSM, then deposit the counterelectrode on the electrolyte in this manner, only one linker ($L^1$) is created by chemical reaction in the stepwise assembly process.

Figure 3:
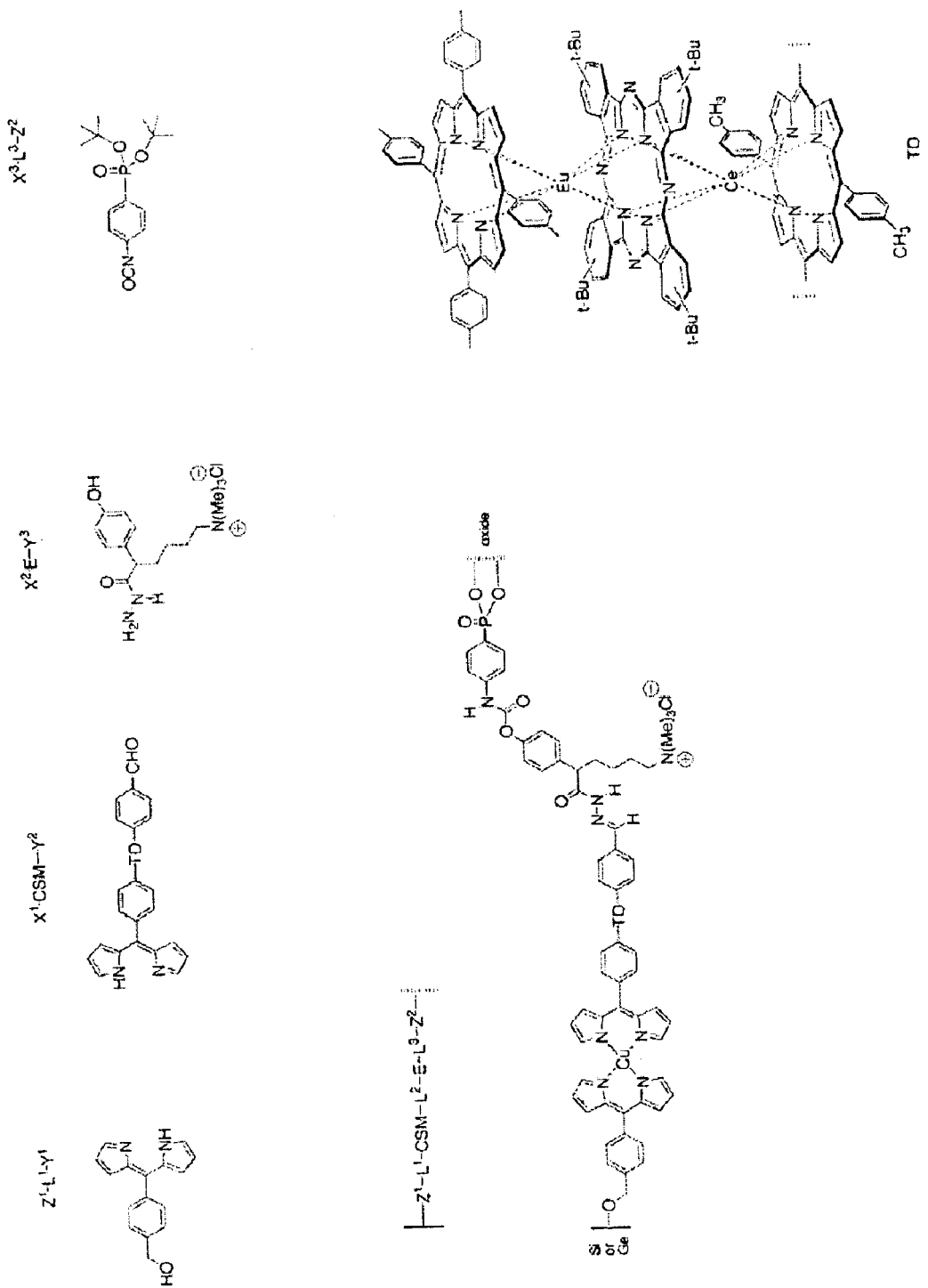
FIG. 3. Example of the components employed in the stepwise assembly of a molecular-based information-storage device employing a heteroleptic heteronuclear triple decker sandwich coordination compound.

Examples. A first example of the stepwise fabrication strategy is shown In FIG. 3. A free base dipyrrin bearing a benzyl alcohol unit is reacted at high concentration and high temperature to give attachment to a semiconductor surface such as silicon or germanium. Copper acetate is then added, forming the copper-dipyrrin adduct. A triple decker sandwich coordination compound bearing a free base dipyrrin is then added to give assembly of the bis(dipyrrinato)copper (II) complex. Bis(dipyrrinato)metal complexes form readily upon exposure of the free base dipyrrin to a metal acetate [Brtickner, C. et al., *Can. J. Chem.* 1996, 74, 2182–2193]. The triple decker affords four cationic states and thus is well suited for multibit information storage. The triple decker also bears a benzaldehyde substituent, which is derivatized in the next step. Triple-decker building blocks having this level of complexity have been prepared [Li, J. et al., *J. Org. Chem.* 2000, 65, 7379–7390; Gryko, D. et al., *J. Mater. Chem.* 2001, 11, 1162–1180; Gross, T. et al., *Inorg. Chem.* 2001, 40, 4762–4774]. The reagent for derivatization of the benzaldehyde is related to the Girard family of reagents, which consist of an acid hydrazide to which is attached a pyridyl unit (Girard's reagent P) or a trimetlhylammonium unit (Girard's reagent T). The Girard reagents have been used for decades as a means of derivatizing aldehydes under very gentle conditions. Indeed, molecules as elaborate as chlorophyll b have been derivatized with these reagents [Wetherell, H. R. and Hendrickson, M. J. *J. Org. Chem.* 1959, 24, 710–711; Losev, A. and Mauzerall, D. *Photochem. Photobiol.* 1983, 38, 355–361]. In this case, the modified Girard's reagent bears two reactive groups (acid hydrazide, phenol) and a fixed charge. Following the formation of the hydrazone, the phenol is reacted with a phenyl isocyanate compound bearing a protected phosplhonate unit. The reaction of the isocyanate and the phenol affords the diaryl carbonate. Deprotection of the phosphonate is achieved with a mild non-nucleophilic base. The counterelectrode is then deposited on the phosphonate species. A wide variety of metal oxides can be used for the counterelectrode. Following each assembly reaction, the excess incoming reactant and any reagents can be washed away.

It should be noted that reactants bearing multiple charged groups can be used for the attached electrolyte. Also, the mobile charge (chloride is shown in FIG. 3) can be exchanged to introduce the mobile counterion of choice (chosen for charge density, mobility, etc.). It is noteworthy that the triple decker is exceptionally resilient and does not undergo decomposition (or metal exchange) under the conditions required for this multistep assembly process.

Figure 4:
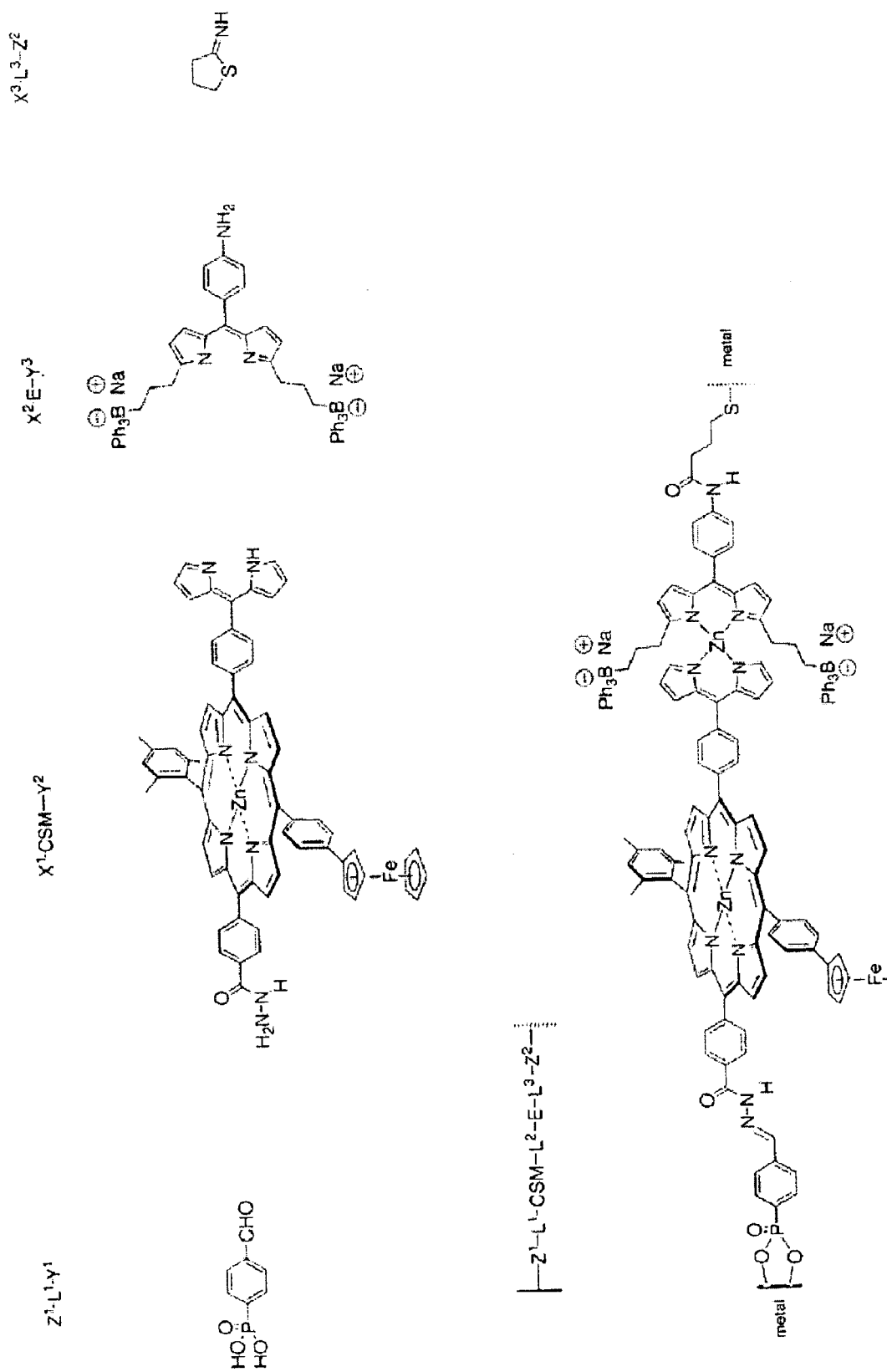
FIG. 4. Example of the components employed in the stepwise assembly of a molecular-based information-storage device employing a ferrocene-zinc porphyrin.

A second example of the stepwise fabrication strategy is shown in FIG. 4. An oxide surface (e.g., zirconium oxide, silicon dioxide, titanium dioxide) is treated with 4-(dihydroxyphosphoryl)benzaldehyde, achieving attachment under mild conditions [Vermeulen, L. A. *Prog. Inorg. Chem.* 1997, 44, 143–166; Katz, H. E. *Chem. Mater.* 1994, 6, 2227–2232]. Then a ferrocene-zinc porphyrin bearing an acid hydrazide and a free base dipyrrin is exposed to the surface, affording the corresponding hydrazone. The ferrocene-zinc porphyrin affords three cationic states and thus is well suited for multibit information storage. Ferrocene-zinc porphyrin building blocks approaching this level of complexity have been prepared [Gryko, D. T. et al., *J. Org. Chem.* 2000, 65, 7356–7362]. A metal reagent such as zinc acetate is then added, followed by a free base dipyrrin bearing two charged groups and an aniline substituent. The bis(dipyrrinato)zinc(II) species forms readily. The aniline unit is then derivatized with 2-iminothiolane (Traut's reagent), yielding the amide to which is attached a free alkylthiol. A wide variety of metals can be deposited on the thiols.

Figure 5:
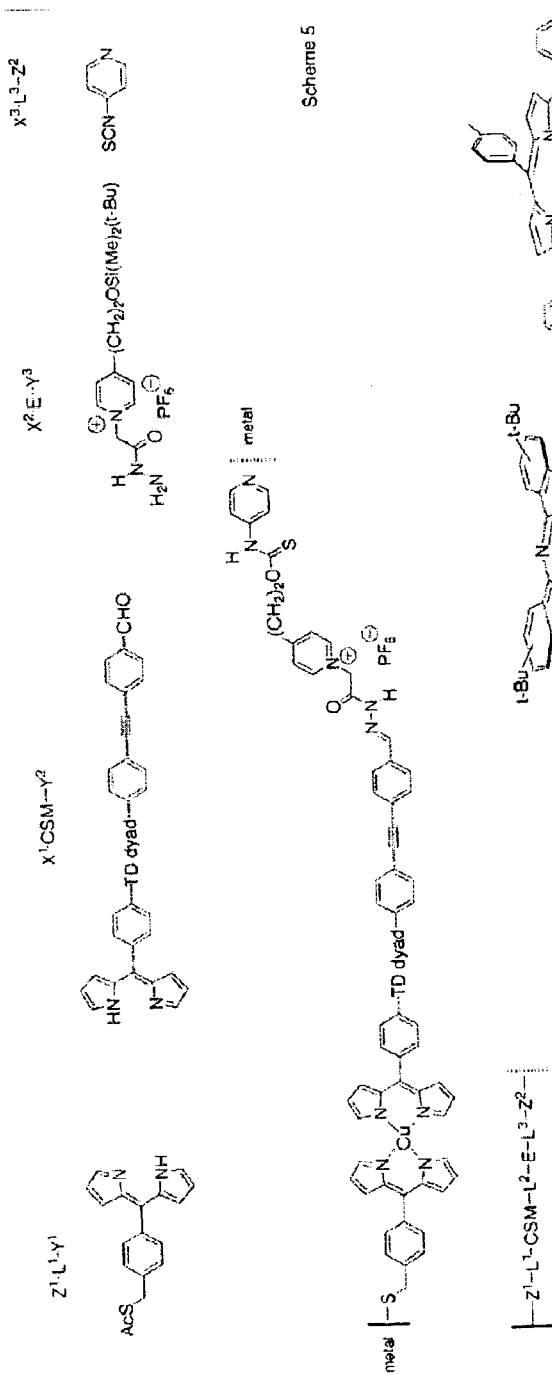
FIG. 5. Example of the components employed in the stepwise assembly of a molecular-based information-storage device employing a dyad of a heteroleptic heteronuclear triple decker sandwich coordination compounds.
Figure 5:
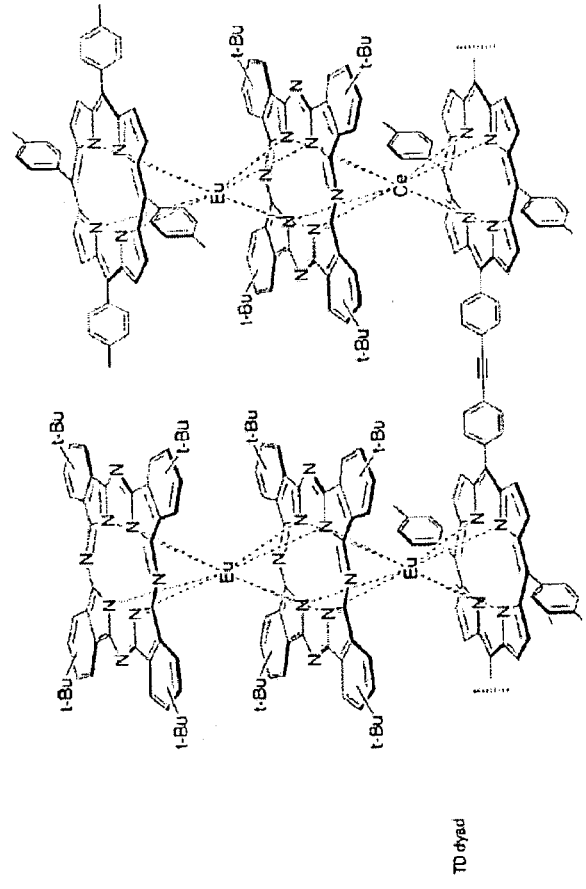

A third example of the stepwise fabrication strategy is shown in FIG. 5. A free base dipyrrin bearing an S-acetylthio group is exposed to a metal surface (e.g., Au). The S-acetyl group is removed in situ [Tour, J. M. et al., *J. Am. Chem. Soc.* 1995, 117, 9529–9534; Gryko, D. T. et al., *J. Org. Chem.* 1999, 64, 8635–8647]. The surface is treated with copper acetate followed by a triple decker dyad bearing a free base dipyrrin and a formal-substituted diphenylethyne linker. The triple decker dyad affords seven cationic states and thus is well suited for multibit information storage.

Triple-decker dyads having this level of complexity have been prepared [Schweikart, K. -H. et al., *J. Mater. Chem.* 2002, 12, 808–828]. The bis(dipyrrinato)copper(II) species forms readily. The carboxaldehyde is then derivatized with a p-(trialkylsilyloxy)substituted Girard's reagent P. The trialkylsilyl group is removed upon treatment with a fluoride reagent under mild conditions. The linker to the counterelectrode is then introduced by reaction with 4-pyridylisothiocyanate, forming the thiocarbamate. A wide variety of metals can be deposited on the pyridyl unit. Note that additional charged material can be incorporated in this assembly as needed by electrostatic binding to the Girard's P component.

These examples are intended to be illustrative. A wide variety of combinations are possible depending on the composition of the electrode and counterelectrode, the nature of the charge-storage molecule, the type of electrolyte desired (fixed cation, mobile anion; or fixed anion, mobile cation), and the composition, structure, and length of the various linkers.

B. Molecular photolithography. The previous section delineates a strategy for the stepwise assembly of the molecular material for an information storage device. In this section, a solution to a related problem is described: how to put distinct types of redox-active molecules, linkers, electrolytes, and related molecular components in distinct locations in a chip.

Methods and apparatus for carrying out photolithography which can be applied to the compounds and methods of making the same described herein are known and can be implemented in accordance with known techniques. In general, photolithography may be carried out with a mask or by "maskless" photolithography with any suitable radiant energy, including electron beam energy, x-ray energy, infrared light including near-infrared light, visible light, ultraviolet light including extreme ultraviolet light, etc (e.g., light in the region of 100–200 nm; 200–400 nm, 400–700 nm; 700–100 nm, etc.). Examples include but are not limited to those described in U.S. Pat. Nos. 6,566,021; 6,537,710; 6,528,331; 6,509,955, 6,506,497; 6,493,867; 6,447,983; etc.

The development of hybrid memory chips relies on standard lithography to create the circuitry and device structures; molecular materials that store charge provide the basis for intonation storage. The exotic conditions for semiconductor fabrication (high temperatures, ablation, etc.) necessitate an approach wherein semiconductor lithography is performed to create the circuitry and devices, then molecular materials are incorporated to complete the chip. No strategies have yet been described whereby molecular-based information storage devices of different type or with different performance characteristics (voltage, charge retention, number of bits, speed of writing/reading) can be incorporated in a given chip. One approach would be to produce devices with distinct surfaces and employ information storage molecules with complementary and orthogonal surface attachment groups. Exposing the chip to successive solutions of distinct types of molecules, or one solution containing a mixture of the molecules, would result in partitioning of the molecules such that binding Occurs between complimentary surfaces and Surface attachment groups. For example, the case described by Gardner wherein orthogonal self-assembly occurs with phosphonates on inidium tin oxide, and thiols on gold, and not vice versa, would enable the successful implementation of this method [Gardner, T. J. et al., *J. Am. Chem. Soc.* 1995, 117, 6927–6933]. While this approach has merit, the main limitations stem from the dearth of distinct surfaces and the incompatibility of many surface attachment protocols with molecules of general form $Z^1$-$L^1$-CSM-$L^2$-E-$L^3$-$Z^{2-}$ An alternative approach with much greater versatility employs photocleavable protecting groups (e.g., molecular photolithography). In this approach, protecting groups are incorporated where appropriate on the various components employed in the fabrication of the molecular information storage material. These components include the surface attachment components, the charge-storage molecule, and the electrolyte (FIG. 1). Molecular photolithography to achieve spatially controlled growth of distinct molecules on a surface is not new. Indeed, this method of "light-directed, spatially addressable parallel chemical synthesis" was developed initially for the construction of 2-dimensional arrays of nucleic acids [Fodor S. P. et al., *Science* 1991, 251, 767–773] and has been used for other polymers [Cho, C. Y. et al., *Science* 1993, 261, 1303–1305]. A major limitation in such approaches initially was the cost of producing the requisite masks. However, virtual masks can now be generated using maskless array synthesizers [Singh-Gasson, S. et al., *Nat. Biotechnol.* 1999, 17, 974–978].

Photocleavable protecting groups are applicable for masking amines, alcohols, carboxylic acids, phosphates, and phosphonate groups [Bochet, C. G. *J. Chem. Soc., Perkin Trans.* 1 2002, 125–142]. For amines, the photocleavable groups of choice are employed as carbamates and include members of the veratryloxycarbonyl family such as 6-nitroveratryloxycarbonyl (NVOC) and other substituted variants that afford different wavelength selectivity [Bochet, C. G. *Tetrahedron Lett.* 2000, 41, 6341–6346], the 3,5-dimethoxybenzyloxycarbonyl group, and various coumarin-based species such as the (6-bromo-7-hydroxycoumarin-4-yl)methioxycar-bonyl unit [Furuta, T. et al., *Proc. Natl. Acad. Sci. USA* 1999, 96, 1193–1200]. For alcohols, the photocleavable groups of choice include ethers derived from the 9-phenylxanthen-9-yl group, the tris(trimethylsilyl)silyl group, or mixed carbonates derived from the 2-(2-nitrophenyl)propyloxycarbonyl group [Beier, M. et al., *Helv. Chim. Acta* 2001, 84, 2089–2095]. For carboxylic acids, the photocleavable groups of choice are employed as esters and include the (6-bromide-7-hydroxycoumarin-4-yl) methoxycarbonyl unit and the 2,4-dinitrobenzensulfenyl ester. A family of protecting groups that employs the phenacyl unit and requires an electron-transfer donor Such as an amine or diamine provides the ability to protect alcohols, carboxylic acids, and phosphates [Banerjee, A. et al., *Tet-*

*rahedron* 1999, 55, 12699–12710]. The alcohols are protected as mixed carbonates, the carboxylic acids as esters, and the phosphates as phosphoesters. The same chemistry that has been developed for protecting phosphates can be used to protect phosphonates. In a number of these cases, other molecules can be employed as sensitizers, absorbing light and transferring excited-state energy to the protecting group which then undergoes cleavage.

A different approach toward photocleavage of protecting groups employs the standard acid-labile protecting groups that find use in solid-phase peptide synthesis or nucleic acid synthesis (e.g., the tert-butyloxycarbonyl or BOC group; the 4,4'-dimethoxytrityl or DMTr group). Groups of this type do not undergo photocleavage but are cleaved upon exposure to acid. To achieve photocleavage, a compound is added to the sample that generates acid upon photolysis. Such "photogenerated acid precursors" are relatively common and can be used as a means of achieving photocleavage without the necessity of replacing widely used protecting groups with new, photocleavable protecting groups [LeProust, E. et al., *J. Comb. Chem.* 2000, 2, 349–354].

Figure 6:
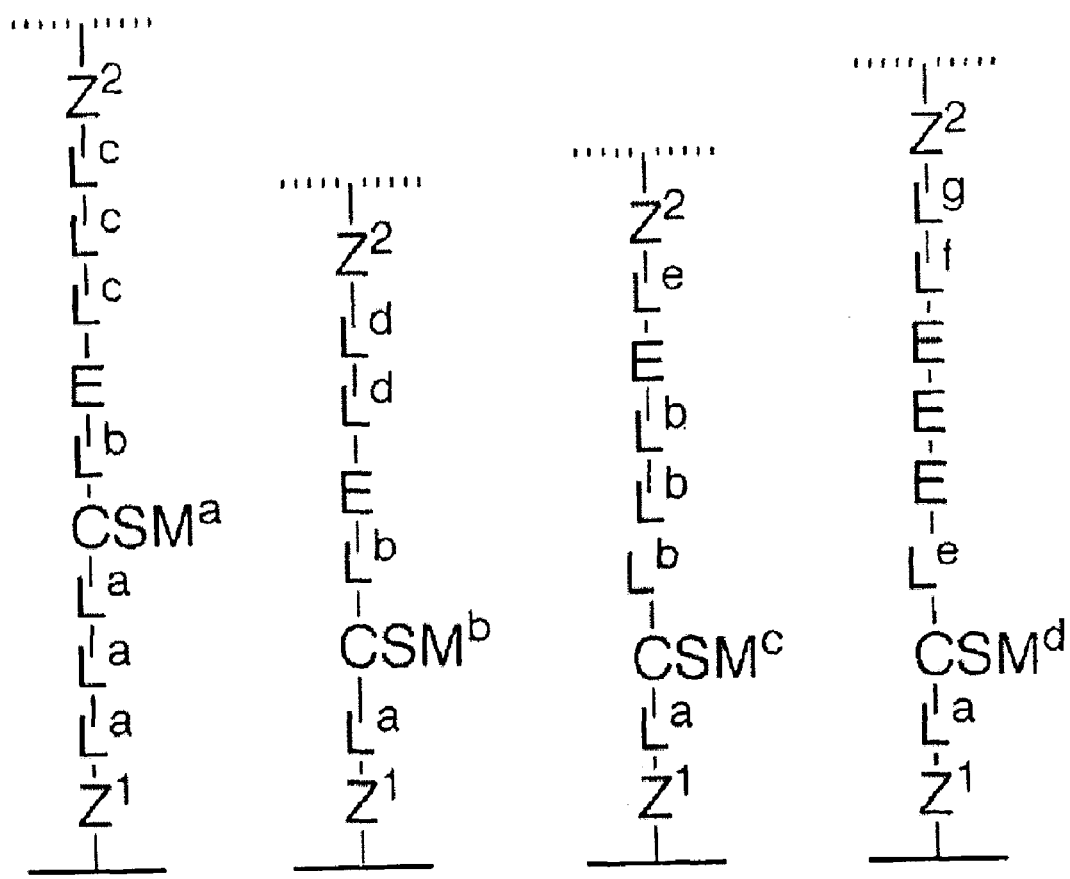
FIG. 6. Example of the diversity in the components in molecular-based information-storage devices in distinct locations in a given chip upon use of stepwise assembly with photocleavable protecting groups and appropriate masks.

FIG. 6 displays an example of the type of diversity that can be created at different locations on a chip using (1) stepwise in situ fabrication, and (2) photocleavable protecting groups in conjunction with appropriate masks. Each of the photocleavable protecting groups described above can be employed with the linkers, linkers bearing surface attachment groups, charge-storage molecules, and electrolytes as described in Part T. In so doing, the number of linker units and their composition can be varied at sites between the electroactive surface and the charge-storage molecule, between the charge-storage molecule and the electrolyte, and between the electrolyte and the counterelectrode. The type of charge-storage molecules that are incorporated can be controlled. The nature of the electrolyte and the number of electrolyte molecules also can be controlled, which influences the properties of the charge-storage molecules. One example would create a multilayer of zirconyl phosphate as the electrolyte; such a layer can be readily achieved in distinct locations through the use of photocleavable protecting groups for the requisite functional groups (e.g., alcohol, phosphonate). Taken together, these synthetic features provide exquisite control over the properties of the molecular memory storage devices at predesignated locations in the hybrid memory chip, including voltage of operation, charge-retention time, number of bits, and speed of writing/erasing.

3. Devices and Use.

The methods described herein may be utilized to prepare an information storage device having different storage characteristics at a plurality of discrete memory locations thereon. The device comprises, in general: (a) a substrate having a plurality of discrete memory location formed thereon, with said discrete memory locations formed on said substrate, preferably at a density of at least 50, 100, 300 or 1000 discrete memory locations per square centimeter, or more; and (b) a different charge storage molecule deposited at each of said discrete memory locations, said charge storage molecules comprising at least one porphyninic macrocycle. The device may further include one or more separate or common electrodes electrically associated with the charge storage molecule at each memory location, such as a separate first and second electrode at each memory locations. It will be appreciated that not every memory location must have a different and distinct charge storage molecule as long as the device includes a plurality (e.g., two, three, four, five, six, ten or more) of different and distinct charge storage molecules: For example, the device may have a first "field" of 100 or more memory locations at a density as per above with one type of storage molecule; a second "field" of 100 or more memory locations at a density as per above with a different storage molecule; etc. The charge storage molecule may further comprise an electrolyte, or a separate electrolyte may be deposited at each of the discrete memory locations. As noted above, the charge storage molecule in some embodiments in at least one (or all) of the memory locations or fields preferably comprises at least one (e.g., two, three, four or more) sandwich coordination complex.

The device may be structured, packaged and used in any suitable fashion, including but not limited to that described in U.S. Pat. Nos. 6,208,553 to Gyko et al.; U.S. Pat. No. 6,381,169 to Bocian et al.; and U.S. Pat. No. 6,324,091 to Gryko et al.; U.S. Pat. No. 6,212,093 to Lindsey; and U.S. Pat. No. 6,451,942 to Li et al. Generally the device provides a method of electrically storing and retrieving information, comprising the steps of: (a) providing an information storage device as described above; (b) storing an electrical charge at at least one of the discrete memory locations to thereby store information; and then (c) determining the presence or absence of a stored electrical charge at said at least one discrete memory locations to thereby retrieve said stored information. Storing may be carried out by any suitable technique, such as by oxidizing the storage molecule by application of a voltage sufficient to oxidize the molecule. In preferred embodiments, the voltage range is less than about 5 volts, more preferably less than about 2 volts, and most preferably less than about 1 or less than about 0.5 volts. The voltage can be the output of any convenient voltage source (e.g. output of an integrated circuit, power supply, logic gate, potentiostat, microprocessor (CPU), etc.) that can provide a voltage/signal for writing, reading, or refreshing the storage cell(s). The method can further involve determining or detecting the oxidation state of the storage molecule and thereby reading out the data stored therein. The detection (read) can optionally involve refreshing the oxidation state of the storage medium (particularly in static-hole devices). The read (detecting) can involve analyzing a readout signal in the time or frequency domain and can thus involve performing a Fourier transform on the readout signal. The detection can be by any of a variety of methods including, but not limited to a volumetric method. One particularly preferred readout utilizes impedance spectroscopy. The readout (detecting) can involve exposing the storage medium to an electric field to produce an electric field oscillation having characteristic frequency and detecting the characteristic frequency. See, e.g., U.S. Pat. No. 6,381,169 to Gryko et al.

The foregoing is illustrative of the present invention, and is not to be construed as limiting thereof. The invention is defined by the following claims, with equivalents of the claims to be included therein.

That which is claimed is:

1. A photolithographic method of making an information storage device having different storage characteristics at a plurality of discrete memory locations thereon, comprising the steps of,
  (a) providing a substrate having a surface portion, said surface portion having a linking group coupled thereto, said linking group having a photocleavable protecting group thereon;
  (b) exposing at least one first discrete segment of said surface portion to radiant energy sufficient to cleave said protecting group from said linking group and generate a deprotected linking group, so that said linking group is deprotected in at least one first discrete memory location and said linking group remains protected in at least one second discrete memory location;

(c) coupling a first charge storage group to said deprotected linking group at said at least one first discrete memory location;

(d) exposing said at least one second discrete memory location to radiant energy sufficient to cleave said protecting group from said linking group and generate a deprotected linking group in said at least one second discrete memory location; and then (e) coupling a second charge storage group to said linking group at said at least one second discrete memory location, wherein said second charge storage (group is different from said first charge storage group, to thereby produce an information storage device having different storage characteristics at a plurality of discrete memory locations.

2. The method of claim 1, wherein said first charge storage group consists essentially of a charge storage molecule.

3. The method of claim 1, wherein said first charge storage group comprises a charge storage molecule coupled to at least one ancillary group, said ancillary group selected from the group consisting of linking groups, electrolyte groups, and charge storage molecules.

4. The method of claim 1, wherein said first exposing step is carried out by masking.

5. The method of claim 1, wherein said first exposing step is carried out by maskless photolithography.

6. The method of claim 1, wherein said radiant energy is selected from the group consisting of electron beam and x-ray energy.

7. The method of claim 1, wherein said radiant energy is selected from the group consisting of near-infrared light, infrared light, visible light, ultraviolet light, and extreme-ultraviolet light.

8. The method of claim 1, wherein said linking group is directly coupled to said surface portion.

9. The method of claim 1, wherein said linking group is coupled to said surface portion through an intermediate charge storage group.

10. A method of making an information storage device having different storage characteristics at a plurality of discrete memory locations thereon, comprising the steps of:

(a) providing a substrate having a surface portion, said surface portion having a charge storage group coupled thereto, said charge storage group having a photocleavable protecting group thereon;

(b) exposing at least one first discrete segment of said surface portion to radiant energy sufficient to cleave said protecting group from said charge storage group and generate a deprotected charge storage group, so that said charge storage group is deprotected in at least one first discrete memory location and said charge storage group remains protected in at least one second discrete memory location;

(c) coupling a first ancillary group to said charge storage group at said at least one first discrete memory location;

(d) exposing at least one second discrete memory location to radiant energy sufficient to cleave said protecting group from said charge storage group and generate a deprotected charge storage group in said at least one second discrete memory location; and then (e) coupling a second ancillary group to said charge storage group at said at least one second discrete memory location, wherein said first ancillary group and said second ancillary group are different, to thereby produce an information storage device having different storage characteristics at a plurality of discrete memory locations.

11. The method of claim 10, wherein said ancillary group is an electrolyte.

12. The method of claim 10, wherein said ancillary group is a linking group.

13. The method of claim 10, wherein said ancillary group is an additional charge storage group.

14. The method of claim 10, wherein a linking group is connected to an electrode at each of said discrete memory locations, said method further comprising the step of coupling a second electrode to an ancillary group at each of said discrete memory locations.

15. The method of claim 10, wherein said first ancillary group is a first linking group and said second ancillary group is a second linking group, said method further comprising the steps of coupling a first conductor to said first linking group and a second conductor to said second linking group, wherein said first and second conductors are different.

16. The method according to claim 15, wherein said first and second linking groups are selected from the group consisting of phosphonate linkers and thiol linkers; and said first and second conductors are selected from the group consisting of metal oxides and gold.

17. The method of claim 10, wherein said exposing step is candied out by masking.

18. The method of claim 10, wherein said exposing step is carried out by maskless photolithography.

19. The method of claim 10, wherein said radiant energy is selected from the group consisting of electron beam and x-ray energy.

20. The method of claim 10, wherein said radiant energy is selected from the group consisting of near-infrared light, infrared light, visible light, ultraviolet light, and extreme-ultraviolet light.

21. The method of claim 10, wherein said charge storage group is directly coupled to said surface portion.

22. The method of claim 10, wherein said charge group is coupled to said surface portion through an intermediate electrolyte group.

* * * * *

UNITED STATES PATENT AND TRADEMARK OFFICE
CERTIFICATE OF CORRECTION

PATENT NO. : 7,005,237 B2  Page 1 of 1
APPLICATION NO. : 10/445977
DATED : February 28, 2006
INVENTOR(S) : Lindsey It is certified that error appears in the above-identified patent and that said Letters Patent is hereby corrected as shown below:

Title page,
Item [56], References Cited, OTHER PUBLICATIONS, should read
"International Search Report for PCT/US04/16379; Date of Mailing May 17, 2005. --.

Column 15,
Line 13, should read -- location, wherein said second charge storage group is --.
Line 27, should read -- 4. The method of claim1, wherein said exposing step --.
Line 29, should read -- 5. The method of claim1, wherein said exposing step --.

Column 16,
Line 5, should read -- (d) exposing said at least one second discrete memory location --.
Line 39, should read -- is carried out by masking. --.

Signed and Sealed this

Twenty-seventh Day of June, 2006

JON W. DUDAS
*Director of the United States Patent and Trademark Office*